United States Patent
Lee et al.

(10) Patent No.: US 6,509,634 B1
(45) Date of Patent: Jan. 21, 2003

(54) CHIP MOUNTING STRUCTURE HAVING ADHESIVE CONDUCTOR

(75) Inventors: Sung-Gue Lee, Pyungtaek (KR); Yong-Il Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/667,008

(22) Filed: Sep. 21, 2000

(30) Foreign Application Priority Data

Sep. 21, 1999 (KR) .......................................... 99-40767

(51) Int. Cl.⁷ .............................................. H01L 23/02
(52) U.S. Cl. ...................... 257/678; 257/665; 257/734; 257/778; 257/779; 257/784
(58) Field of Search ................................. 257/737, 738, 257/778, 779, 780, 784, 678, 665, 620, 746, 741, 781; 438/106, 108, 118; 228/180, 22; 361/704, 707, 710

(56) References Cited

U.S. PATENT DOCUMENTS

| | | | |
|---|---|---|---|
| 5,019,944 A | | 5/1991 | Ishii et al. |
| 5,878,486 A | * | 3/1999 | Eldridge et al. ............. 29/840 |
| 6,078,500 A | * | 6/2000 | Beaman et al. ............. 361/704 |
| 6,204,681 B1 | * | 3/2001 | Nagatsuka et al. ......... 324/761 |
| 6,229,217 B1 | * | 5/2001 | Fukui et al. ................ 257/777 |

* cited by examiner

*Primary Examiner*—Phat X. Cao
*Assistant Examiner*—Theresa T. Doan
(74) *Attorney, Agent, or Firm*—Birch, Stewart, Kolasch & Birch, LLP

(57) ABSTRACT

A chip mounting structure provides an adhesive conductor between a chip and a printed circuit board. The adhesive conductor includes an adhesive layer having viscoelasticity to cushion thermal shock caused due to a difference in the thermal expansive coefficients between mutually connected layers; and conductive wires for electrically connecting the layers by vertically penetrating the adhesive layer. The adhesive conductor in accordance with the present invention includes a plurality of conductive wires penetrating the adhesive layer having viscoelasticity in a half-hardened state, so that the chip and the printed circuit board can be physically attached and at the same time be electrically connected. Also, the flip chip structure is protected from the thermal shock caused due to the difference between the thermal expansive coefficients of the chip and the printed circuit board, so that products fabricated by adopting it can have a high reliability.

25 Claims, 3 Drawing Sheets

CHIP MOUNTING STRUCTURE HAVING ADHESIVE CONDUCTOR

BACKGROUND OF THE INVENTION

1. Field of the Invention

The present invention relates to a chip mounting structure having an adhesive conductor and a flip chip structure having the same, and more particularly, to a chip mounting structure having an adhesive conductor for electrically connecting a printed circuit board and a chip in a flip chip structure in which the chip is directly mounted on the printed circuit board.

2. Description of the Background Art

Generally, an integrated circuit (IC) device such as a semiconductor chip is fabricated in a package in a manner that when it is mounted on a lead frame as a conductor it is molded by resin. At this time, outer leads of the lead frame are outwardly extended so that it is electrically connected with an electrode layer of a circuit pattern formed on the printed circuit board by soldering.

Meanwhile, recently, in order to follow the current trend that electric and electronic instruments become compact, electronic parts makers increasingly supply set makers with a flip chip where a bare chip element forming an electronic circuit on a silicon wafer is directly mounted on an electrode pad formed on an electronic circuit wiring of the printed circuit board with omission of a typical packaging process. That is so-called SMD (Surface Mounting Device) technology.

A flip chip technique refers to directly mounting a chip on a printed circuit board (PCB), of which construction is as shown in FIG. 1.

With reference to FIG. 1, plural pads 3 are formed on a printed circuit board 1. On the printed circuit board 1, a chip 5 (to be described) or other chips or other parts are mounted.

The chip 5 is mounted on the printed circuit board. Plural pads 6 are formed on the lower portion of the chip 5. The pads 6 and the pads 3 formed on the printed circuit board 1 and the chip 5 serve to electrically connect the chip 5 and the printed circuit board 1.

In order to electrically connect the chip 5 and the printed circuit board 1, when the chip 5 is mounted on the printed circuit board 1, an adhesive 8 including conductive particles 9 formed at constant intervals in a Z-axis direction (the direction of connecting the chip 5 with PCB 1) is used in a paste or film state.

As the adhesive 8, an ACF (anisotropic conductive film), an ACP (anisotropic conductive paste) or ICP (isotropic conductive paste) is used. That is, conductive particles 9 are positioned at constant intervals in the Z-axis direction inside the adhesive 8, and pressure and heat are applied between the printed circuit board 1 and the chip 5, thereby connecting the pads 3 and 6.

The above described flip chip structure of the conventional art has advantages with respect to the technique that the pads 3 of the printed circuit board 1 and the pads 6 of the chip 5 are electrically connected, in that the overall structure can be accomplished to be small and light, a noise caused by an unnecessary connection circuit can be reduced, and its productivity can be improved.

However, the conventional flip chip structure has the following problems.

First, in view of a fabricating technique of the ACF and the ACP, there is no solution to the occurrence of electrical short and open state in the X-Y axis direction. That is, with reference to FIG. 2, in the process that the chip 5 is mounted on the printed circuit board 1 by applying pressure and heat, the conductive particles 9 inside the adhesive 8 such as the ACF and the ACP are scattered in the X-Y axis direction, so that electrical short and open state occur.

The electrical open state deteriorates the connection between the pad 3 of the printed circuit board and the pad 6 of the chip, disturbing the smooth flowing of current, while the electrical short causes the pads to be electrically conducted improperly, resulting in a critical damage to the chip.

Therefore, when the electrical short and electrical open state occurs in the process of mounting the chip 5 on the printed circuit board 1, the high-priced chip 5 is damaged.

Also, as to the conventional art, when the printed circuit board has multiple parts mounted thereon, a heat impact caused due to a difference between the thermal expansive coefficient of the printed circuit board 1 and that of the chip 5 may be applied to the conductive particles 9, breaking down the connection between the pads 3 and 6.

SUMMARY OF THE INVENTION

Therefore, an object of the present invention is to provide a chip mounting structure including a conductor which is capable of electrically connecting elements that are formed by layers without electrical shorts and open states.

Another object of the present invention is to prevent a thermal mismatch caused due to a difference of a thermal expansive coefficient between layers in electrically connecting the elements formed by layers.

Still another object of the present invention is to provide a flip chip structure in which a chip is mounted on a printed circuit board by using the conductor.

To achieve these and other advantages in accordance with the purpose of the present invention, as embodied and broadly described herein, there is provided an adhesive conductor including: an adhesive layer having viscoelasticity to release thermal shock caused due to difference of the thermal expansive coefficients between mutually connected layers; and a conductive wire for electrically connecting the layers by vertically penetrating the adhesive layer.

The adhesive layer may be a silicon rubber adhesive in a semi-hardened state or may be constructed by providing upper and lower surfaces of silicon in a hardened state with an adhesive component.

The conductive wire may be vertically formed in a straight line penetrating the adhesive layer, or may vertically penetrate the adhesive layer and be formed bent several times.

It is preferred that a connection portion is formed at both ends of the conductive wire for external connection.

In order to achieve the above objects, there is also provided a chip mounting structure including: a printed circuit board having a curcuit pattern and plural pads; a chip having plural pads and mounted on the printed circuit board; and an adhesive conductor for attaching and electrically connecting the printed circuit board with the chip.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
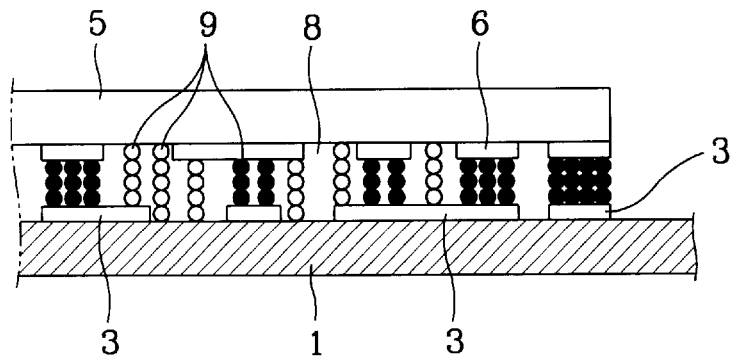
FIG. 1 is a sectional view showing a major part of a flip chip structure in accordance with a conventional art.
Figure 2:
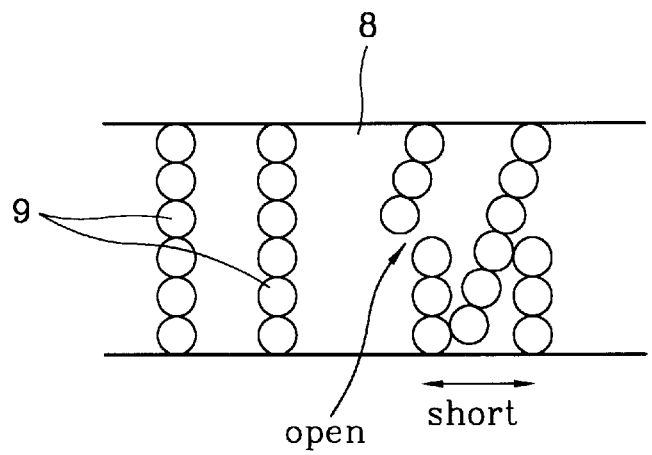
FIG. 2 is a view showing a problem of the flip chip structure in accordance with the conventional art.
Figure 3:
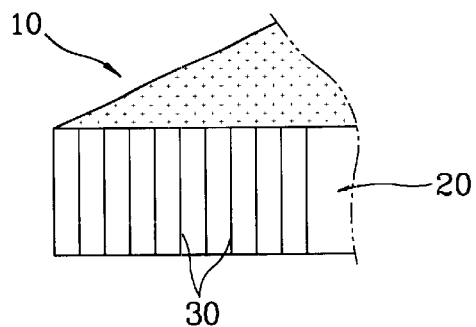
FIG. 3 is a partial sectional perspective view showing a construction of a conductor in accordance with one embodiment of the present invention.

FIG. 3 is a partial sectional perspective view showing a construction of a conductor in accordance with one embodiment of the present invention.

As shown in the drawing, an adhesive conductor 10 includes an adhesive layer 20 and conductive wires 30 disposed to vertically penetrate through the adhesive layer 20.

The adhesive layer 20 is made of a silicon rubber adhesive in a half-hardened state. As the adhesive layer 20, a polymer film may be used.

The conductive wires 30 electrically connect the elements (e.g., chip and PCB) respectively attached on the upper surface and lower surface of the adhesive layer 20 by vertically penetrating the adhesive layer 20. The conductive wires 30 are made of a metal material having a good electrical conductivity. That is, the conductive wires 30 are formed of one of gold (Au), gold-plated copper (Cu), silver (Ag), aluminum (Al) and carbon (C).

Each having a diameter of more than 10 μm, the conductive wires 30 are preferably disposed at a pitch of more than 5 μm in the adhesive layer 20. All of the conductive wires 30 disposed at constant intervals do not necessarily serve to electrically connect the elements attached between the upper and lower portions of the adhesive conductor 10. Only the conductive wires that are connected with the pad of each element serve for electrical connection therebetween.

Figure 4A:
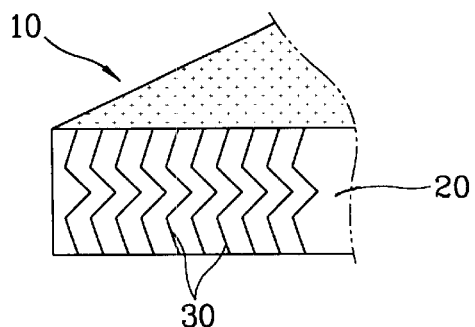
FIGS. 4A through 4C are partial sectional perspective views showing modifications of a conductor in accordance with other embodiments of the present invention.
Figure 4B:
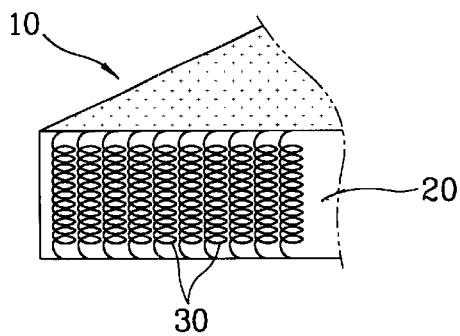
Figure 4C:
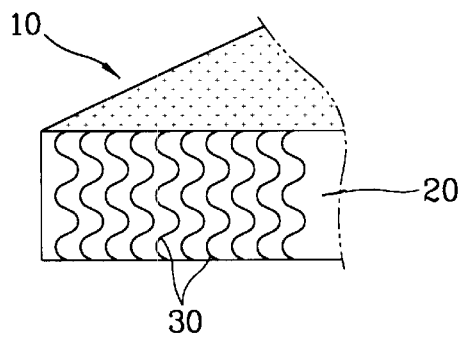

FIGS. 4A through 4C are partial sectional perspective views showing modifications of a conductor in accordance with other embodiments of the present invention.

First, with reference to FIG. 4A, the conductive wires 30 are formed bent several times to form certain angles. FIG. 4B shows conductive wires 30 formed in a screw or spiral shape. FIG. 4C shows conductive wires 30 formed in a wave shape.

With such shapes, the conductive wires are lengthened so that they effectively cope with a thermal shock caused by elements attached on the upper and lower portions of the adhesive conductor 10 or any external impact.

That is, although the thermal shock caused by elements attached on the upper and lower portions of the adhesive layer 20 having different thermal expansive coefficients to each other is applied to the adhesive layer 20 and thus the elements are deformed to different degrees, respectively, since there is a room for the conductive wires in view of their length, electrical connection between the elements of the upper and lower layers are not cut off.

Figure 5:
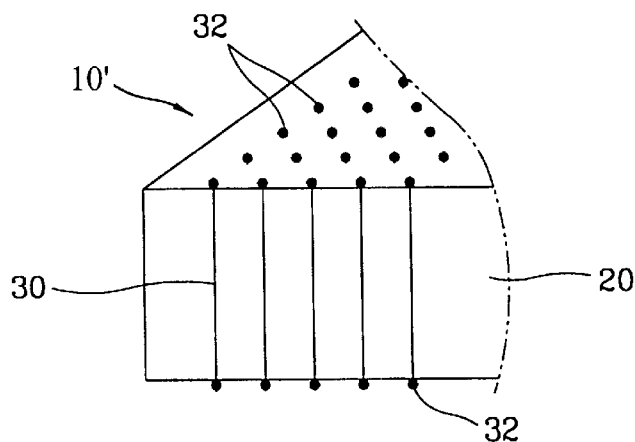
FIG. 5 is a partial sectional perspective view showing a construction of a conductor in accordance with another embodiment of the present invention.

FIG. 5 is a partial sectional perspective view showing a construction of an adhesive conductor 10' in accordance with another embodiment of the present invention.

As shown in the drawing, a bump 32 is formed respectively at both end portions of each of the conductive wires 30 disposed to penetrate the adhesive layer 20. The bumps 32 are connected with the pads of the elements that are respectively attached on the upper and lower surfaces of the adhesive conductor 10'.

Each bump 32 is formed to have a larger diameter than that of the conductive wires 30. The bump 32 enlarges the are where the bump 32 contacts the pad to be connected, to thereby serve to fortify stability in the electrical connection.

Figure 6:
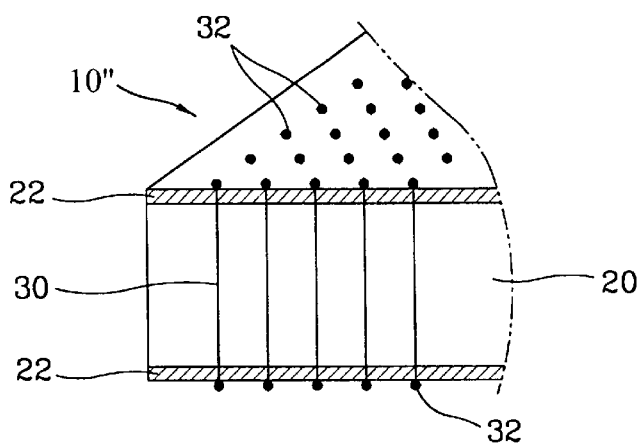
FIG. 6 is a partial sectional perspective view showing a construction of a conductor in accordance with another embodiment of the present invention.

FIG. 6 is a partial section perspective view showing a construction of an adhesive conductor 10" in accordance with another embodiment of the present invention. In this embodiment, the adhesive layer 20 us formed by a hardened silicon, on the both surfaces of which adhesive 22 is coated with a certain thickness.

The adhesive conductors 10, 10' and 10" can be used in case where the elements such as the chip are stacked to several layers or in case there the elements are mounted on the printed circuit board. At this time, the adhesive layer 20 made of a silicon material has the viscoelasticity so that it serves as a buffer that absorbs the thermal shock that may be generated by to the different thermal expansive coefficients among elements or the printed circuit board.

Accordingly, even though an element is deformed due to the heat generated from the element attached on the printed circuit board where it is used in a device, since the adhesive layer 20 of the adhesive conductors 10, 10' and 10" play a role as a buffer therefor, a reliability of the product can be improved.

The structure in which the chip is mounted on the printed circuit board by using the adhesive conductors 10, 10' and 10" will be explained.

Figure 7:
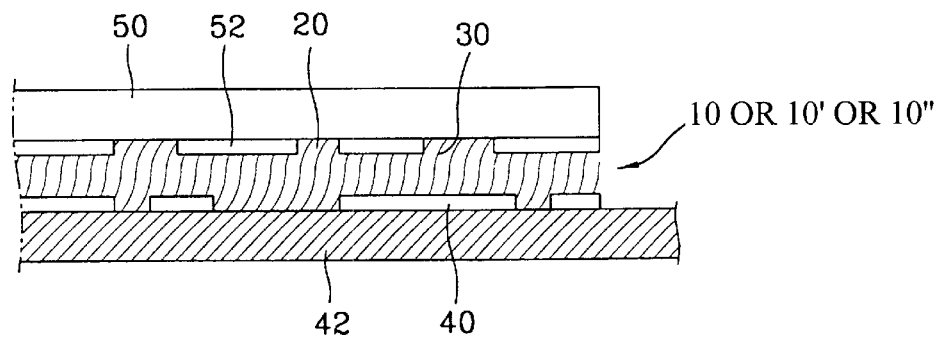
FIG. 7 is a sectional view of a flip chip structure in accordance with the present invention.

FIG. 7, is a sectional view of a flip chip structure in which a chip 50 is mounted on a printed circuit board 42 by using one of the adhesive conductors 10, 10' and 10" in accordance with the present invention.

Plural pads 40 are formed on the printed circuit board 42. The pads 40 serve to electrically connect the chip 50 (to be described). Besides the chip 50, a plurality of elements can be mounted on the printed circuit board 42. The chip 50 is mounted on the printed circuit board, and pads 52 are formed on the lower surface of the chip 50 for electrical connection with the printed circuit board 42.

In this respect, in order to mount the chip on the printed circuit board 42, one of the adhesive conductors 10, 10' and 10" is used. That is, the upper surface of the adhesive conductor 10, 10' or 10" is attached on the chip 50 and the lower surface thereof is attached on the printed circuit board 42, thereby mounting the chip 50 on the printed circuit board 42 positively.

At this time, the conductive wires 30 serves to electrically connect the printed circuit board 42 and the chip 50 by vertically penetrating through the adhesive layer 20 of the adhesive conductor 10, 10' or 10". That is, only those conductive wires 30 contacting the pads 40 and 52 among all the conductive wires 30 serve to electrically connect the printed circuit board 42 and the chip 50. The other conductive wires 30 that do not contact the pads 42 and 52 are not used for electrical connection between the printed circuit board and the chip.

With the chip mounting structure as above described, the adhesive conductors 10, 10' and 10" and the chip 50 are stacked in turn on the printed circuit board 42, to which heat and pressure are adequately applied so as to attach the chip 50 on the printed circuit board 42 by means of the adhesive conductors 10, 10' and 10".

Of course, the pad 52 of the chip 50 and the pad 40 of the printed circuit board 42 are designed to be positioned correspondingly to each other and electrically connected by the conductive wires 30.

Of course, the pad 52 of the chip 50 and the pad 40 of the printed circuit board 42 are designed to be positioned correspondingly to each other and electrically connected by the conductive wires 20.

The adhesive conductors 10, 10' and 10" in use for the chip mounting structure is not limited thereto. They may be used for an MLB (multi layered board) having plural layers, or may be used for a substrate such as a BGA (ball grid array) or a CSP (chip size package) for semiconductor. In addition, they may be used for connecting different circuits or conductive layers.

As so far described, the adhesive conductor in accordance with the present invention is formed including a plurality of conductive wires penetrating the adhesive layer having viscoelasticity in a half-hardened state, so that the chip and the printed circuit board can be physically attached and at the same time can be electrically connected.

Also, the flip chip structure in accordance with the present invention is protected from the thermal shock caused due to the difference between the thermal expansive coefficients between the chip and the printed circuit board, so that products fabricated by adopting it can have a high reliability and improved performance.

Especially, since the adhesive conductor is positioned between the chip and the printed circuit board, the conductive wires are prevented from entering an open state and a short in the process of attaching the chip and the printed circuit board by applying head and pressure.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A chip mounting structure comprising:
   a printed circuit board having a circuit pattern and plural pads;
   a chip having plural pads and mounted on the printed circuit board; and
   an adhesive conductor for mounting the chip onto the printed circuit board, the adhesive conductor including an adhesive layer positioned between the printed circuit board and the chip, and conductive wires disposed to penetrate the adhesive layer and positioned irrespective of locations of contacts on any one of the printed circuit board and the chip;
   wherein said conductive wires are formed in a non-linear shape, said conductive wires penetrating the adhesive layer being electrically connected with a pad attached on the upper surface of the printed circuit board and a pad attached on the lower surface of the chip.

2. The chip mounting structure according to claim 1, wherein the adhesive layer is a silicon rubber adhesive in a half-hardened state.

3. The chip mounting structure according to claim 1, wherein the adhesive layer is constructed by providing upper and lower surfaces of silicon in a hardened state with an adhesive component.

4. The chip mounting structure according to claim 1, wherein the conductive wires vertically penetrate the adhesive layer and are bent several times.

5. The chip mounting structure according to claim 1, wherein the conductive wires are formed in a spiral shape.

6. The chip mounting structure according to claim 1, wherein a bump is formed at both end portions of each of the conductive wires penetrating the adhesive layer.

7. The chip mounting structure according to claim 6, wherein the bump is connected with the pads of the printed circuit board and the chip that are respectively attached on the upper and lower surfaces of the adhesive conductor, and has a larger diameter than that of the conductive wires.

8. The chip mounting structure according to claim 1, wherein the conductive wires are formed of one of gold (Au), gold-plated copper (Cu), silver (Ag), aluminum (Al) and carbon (C).

9. The chip mounting structure according to claim 1, wherein the conductive wires are formed in a wave shape.

10. The chip mounting structure according to claim 1, wherein the conductive wires extend vertically so that they are perpendicular to at least one of the printed circuit board and the chip.

11. The chip mounting structure according to claim 1, wherein the conductive wires are disposed at uniform intervals.

12. The chip mounting structure according to claim 11, wherein each of the conductive wires includes two ends that are aligned with each other.

13. The chip mounting structure according to claim 11 wherein the conductive wires are disposed to contact the contacts on the chip and to contact the chip directly in areas between the contacts on the chip, and are distributed to cover an entire mounting surface of the chip.

14. A mounting structure for electrically connecting first and second elements, the structure comprising:
   an adhesive conductor for attaching the first and second elements, the adhesive conductor including:
   an adhesive layer; and
   conductive wires penetrating the adhesive layer and extending through the adhesive layer, for electrically connecting the first and second elements, wherein the conductive wires are formed in a non-linear shape and positioned irrespective of locations of contacts on any one of the first and second elements.

15. The mounting structure according to claim 14, wherein the conductive wires vertically penetrate the adhesive layer and are bent several times.

16. The mounting structure according to claim 14, wherein the conductive wires are formed in a wave shape.

17. The mounting structure according to claim 14, wherein a bump is formed at both end portions of each of the conductive wires penetrating the adhesive layer.

18. The mounting structure according to claim 14, wherein the conductive wires extend vertically so that they are perpendicular to at least one of the printed circuit board and the chip.

19. The mounting structure according to claim 14, wherein the conductive wires are formed of one of gold (Au), gold-plated copper (Cu), silver (Ag), aluminum (Al) and carbon (C).

20. The mounting structure according to claim 14, wherein the adhesive layer is a silicon rubber adhesive in a half-hardened state.

21. The mounting structure according to claim 14, wherein the first and the second elements are a chip and a board, respectively.

22. The mounting structure according to claim 14, wherein the conductive wires include curved portions.

23. The mounting structure according to claim 14, wherein the conductive wires are disposed at uniform intervals.

24. The mounting structure according to claim 23, wherein each of the conductive wires includes two ends that are aligned with each other.

25. The mounting structure according to claim 23, wherein the conductive wires are disposed to contact the contacts on the first element and to contact the first element directly in areas between the contacts on the first element, and are distributed to cover an entire mounting surface of the first element.

* * * * *